US008031202B2

(12) United States Patent
Perronnin

(10) Patent No.: US 8,031,202 B2
(45) Date of Patent: Oct. 4, 2011

(54) COLOR TRANSFER BETWEEN IMAGES THROUGH COLOR PALETTE ADAPTATION

(75) Inventor: Florent Perronnin, Domene (FR)

(73) Assignee: Xerox Corporation, Norwalk, CT (US)

( * ) Notice: Subject to any disclaimer, the term of this patent is extended or adjusted under 35 U.S.C. 154(b) by 854 days.

(21) Appl. No.: 12/045,807

(22) Filed: Mar. 11, 2008

(65) Prior Publication Data

US 2009/0231355 A1 Sep. 17, 2009

(51) Int. Cl.

| | |
|---|---|
| ***G09G 5/00*** | (2006.01) |
| ***G09G 5/02*** | (2006.01) |
| ***H04N 5/202*** | (2006.01) |
| ***H04N 1/46*** | (2006.01) |
| ***H04N 5/46*** | (2006.01) |
| ***G03F 3/08*** | (2006.01) |
| ***G06K 9/00*** | (2006.01) |
| *H04N 11/00* | (2006.01) |
| *G06K 9/40* | (2006.01) |

(52) U.S. Cl. ........ 345/594; 345/591; 345/581; 345/619; 345/428; 348/254; 348/498; 348/557; 358/518; 358/519; 358/537; 358/448; 382/167; 382/254; 382/274; 382/164

(58) Field of Classification Search .................. 345/428, 345/581, 589–591, 593–594, 600, 606, 618–619, 345/643, 549; 348/254, 268, 496, 498, 503, 348/557, 552, 577, 518–519, 537, 527, 448, 348/525; 382/162–167, 173, 254, 274, 276

See application file for complete search history.

(56) References Cited

U.S. PATENT DOCUMENTS

| | | | | |
|---|---|---|---|---|
| 5,802,361 | A * | 9/1998 | Wang et al. | 382/217 |
| 6,807,300 | B1 * | 10/2004 | Gindele et al. | 382/167 |
| 2003/0007687 | A1 * | 1/2003 | Nesterov et al. | 382/167 |
| 2007/0242162 | A1 * | 10/2007 | Gutta et al. | 348/645 |
| 2007/0253623 | A1 * | 11/2007 | Ohira et al. | 382/218 |
| 2010/0295959 | A1 * | 11/2010 | Steinberg et al. | 348/222.1 |
| 2011/0032392 | A1 * | 2/2011 | Litvinov et al. | 348/241 |

OTHER PUBLICATIONS

Gauvain et al., "MAP Estimation of Continuous Density HMM: Theory and Applications," Proc. DARPA Speech & Nat. Lang., Morgan Kaufmann, pp. 1-6, 1992.

Dempster et al., "Maximum Likelihood from Incomplete Data via the EM Algorithm," Journal of the Royal Statistical Society Series B (Methodological), vol. 39, No. 1 pp. 1-38, 1977.

Woolfe, "Natural Language Color Editing," ISCC, pp. 1-5, 2007.

(Continued)

*Primary Examiner* — Wesner Sajous
(74) *Attorney, Agent, or Firm* — Fay Sharpe LLP

(57) ABSTRACT

An image adjustment includes adapting a universal palette to generate (i) an input image palette statistically representative of pixels of an input image and (ii) a reference image palette statistically representative of pixels of a reference image, and adjusting at least some pixels of the input image to generate adjusted pixels that are statistically represented by the reference image palette. In some embodiments, a user interface for controlling the image adjustment includes a display and at least one user input device, the user interface displaying a set of colors indicative of the regions of color space represented by a palette and receiving a selection of one or more regions of the color space, so that the image adjustment adjusts those pixels of the input image lying within the one or more selected regions of the color space.

23 Claims, 3 Drawing Sheets

OTHER PUBLICATIONS

Tai et al., "Local Color Transfer via Probabilistic Segmentation by Expectation-Maximization," IEEE Int. conf. on Computer Vision and Pattern Recognition (CVPR), vol. 1, 2005.
Chang et al., "Example-Based Color Stylization Based on Categorical Perception," Applied perception in graphics and visualization, vol. 73, 2004.
Chang et al., "Example-Based Color Transformation for Image and Video," ACM, pp. 347-353, 2005.
Reinhard et al., "Color Transfer between Images," IEEE Computer Graphics and Applications, vol. 21, Issue 5, pp. 34-41, 2001.
Gauvain et al., "Maximum A Posteriori Estimation for Multivariate Gaussian Mixture Observations of Markov Chains," IEEE trans. On Speech and audio Processing, 1994.
Woodland, "Speaker Adaptation: Techniques and Challenges," Proc. IEEE Workshop on Automatic Speech Recognition and Understanding (ASRU), 2000.
Pitie et al., "N-Dimensional Probability Density Function Transfer and its Application to Colour Transfer," IEEE Int. conf. on computer Vision (ICCV), vol. 2, 2005.

* cited by examiner

COLOR TRANSFER BETWEEN IMAGES THROUGH COLOR PALETTE ADAPTATION

BACKGROUND

The following relates to the image processing, image presentation, photofinishing, and related arts.

The rise of digital photography and digital video has empowered amateur and professional photographers and cinematographers to perform photographic and video processing previously requiring expensive and complex darkroom facilities. Today, even amateur photographers can readily use home computers running photofinishing software to perform operations such as image cropping, brightness, contrast, and other image adjustments, merging of images, resolution adjustment, and so forth.

One task that has largely eluded such persons, however, is effective color adjustment. The difficulty is not lack of available tools—to the contrary, most image processing software provides a wide range of color adjustments such as color balance, hue, saturation, intensity, and so forth, typically with fine control such as independent channel adjustment capability for the various channels (e.g., the red, green, and blue channels in an RGB color space). The difficulty is that effective use of these color adjustment tools presupposes a level of color science knowledge and expertise that is beyond the capability of most amateur photographers and cinematographers, and even beyond the capability of some professionals. Additionally, using such color adjustment tools can be time-consuming, especially when dealing with long sequences of video frames or other large image collections.

Accordingly, there has been interest in the automation and simplification of color adjustment processing. One approach that has been to make standard color adjustments for certain color regions. For example, the color space may be broken up into palette regions, e.g. a red region, an orange region, a yellow region, and so forth, and a standard adjustment applied to image pixels in each palette region, such as a standard adjustment for pixels in the red region that shifts the pixel toward orange by a predetermined amount. Such adjustments can be performed relatively safely. For example, using a suitable transform it can be ensured that a reddish pixel will remain reddish after adjustment. To ensure a safe color transform, the color adjustment of each pixel can be bounded to remain within the palette region of the pixel.

These existing approaches are relatively inflexible. It is difficult to modify the transforms to accommodate different personal color preferences, or different images under adjustment, or other deviations from the general characteristics of the training images based upon which the transform was constructed. There is typically no intuitive way for the user to modify the color palette or transforms to adapt the color adjustment system to different personal color preferences, or different images under adjustment, or other deviations.

BRIEF DESCRIPTION

In some illustrative embodiments disclosed as illustrative examples herein, an image adjustment system is disclosed, comprising: an adaptive palette processor configured to adapt a universal palette to generate (i) an input image palette statistically representative of pixels of an input image and (ii) a reference image palette statistically representative of pixels of a reference image; and an image adjustment processor configured to adjust at least some pixels of the input image to generate adjusted pixels that are statistically represented by the reference image palette.

In some illustrative embodiments disclosed as illustrative examples herein, an image adjustment method is disclosed, comprising: adapting a universal palette to generate (i) an input image palette statistically representative of pixels of an input image and (ii) a reference image palette statistically representative of pixels of a reference image; and adjusting at least some pixels of the input image to generate adjusted pixels that are statistically represented by the reference image palette.

In some illustrative embodiments disclosed as illustrative examples herein, an image adjustment system is disclosed, comprising: an image adjustment processor configured to adjust at least some pixels of an input image to generate adjusted pixels that are statistically represented by a reference palette defined by a mixture model in which each mixture model component is representative of a region of a color space; and a user interface including a display and at least one user input device, the user interface configured to display a set of colors indicative of the regions of color space represented by the mixture model components and to receive a selection of one or more regions of the color space represented by the mixture model components, the image adjustment processor configured to adjust those pixels of the input image lying within the one or more selected regions of the color space.

DETAILED DESCRIPTION

The color adjustment approaches set forth herein advantageously provide flexible color adjustment that can be accommodated to different image adjustment tasks and to the preferences of different users in an intuitive manner. In a commonly encountered situation, the user has an image whose coloration is not pleasing to the user. The user may or may not be able to articulate why the coloration of the image is not pleasing. To assess the displeasing coloration, the user compares the image with a reference image whose coloration is more pleasing to the user. Then what the user wants to do is to adjust the coloration of the image to be more like that of the reference image.

The color adjustment techniques disclosed herein readily accommodate such situations. The user provides as inputs the image and the reference image, and optionally one, two, or a few additional parameters. The color adjustment technique then derives and applies suitable color transformations that adjust the coloration of the image, or adjust the coloration of selected color regions of the image, to more closely match the pleasing coloration of the reference image.

The term "color" as used herein is intended to broadly encompass any characteristic or combination of characteristics of the image pixels to be adjusted. For example, the "color" may be characterized by one, two, or all three of the red, green, and blue pixel coordinates in an RGB color space representation, or by one, two, or all three of the L, a, and b pixel coordinates in an Lab color space representation, or by one or both of the x and y coordinates of a CIE chromaticity representation, or so forth. Additionally or alternatively, the color may incorporate pixel characteristics such as intensity, hue, brightness, or so forth. Moreover, while the color adjustment techniques are described herein with illustrative reference to two-dimensional images such as photographs or video frames, it is to be appreciated that these techniques are readily applied to three-dimensional images as well. The term "pixel" as used herein is intended to denote "picture element" and encompasses image elements of two-dimensional images or of three dimensional images (which are sometimes also called voxels to emphasize the volumetric nature of the pixels for three-dimensional images).

Moreover, since the techniques disclosed herein operate at the pixel level without regard to the position of pixels in the input image, these techniques can be applied to any group of pixels, and are not restricted to pixels of a single static two-dimensional image. For example, the pixels comprising a stream of video frames can be processed together as a single group of pixels, and in such a case the "input image" is the stream of video frames.

Figure 1:
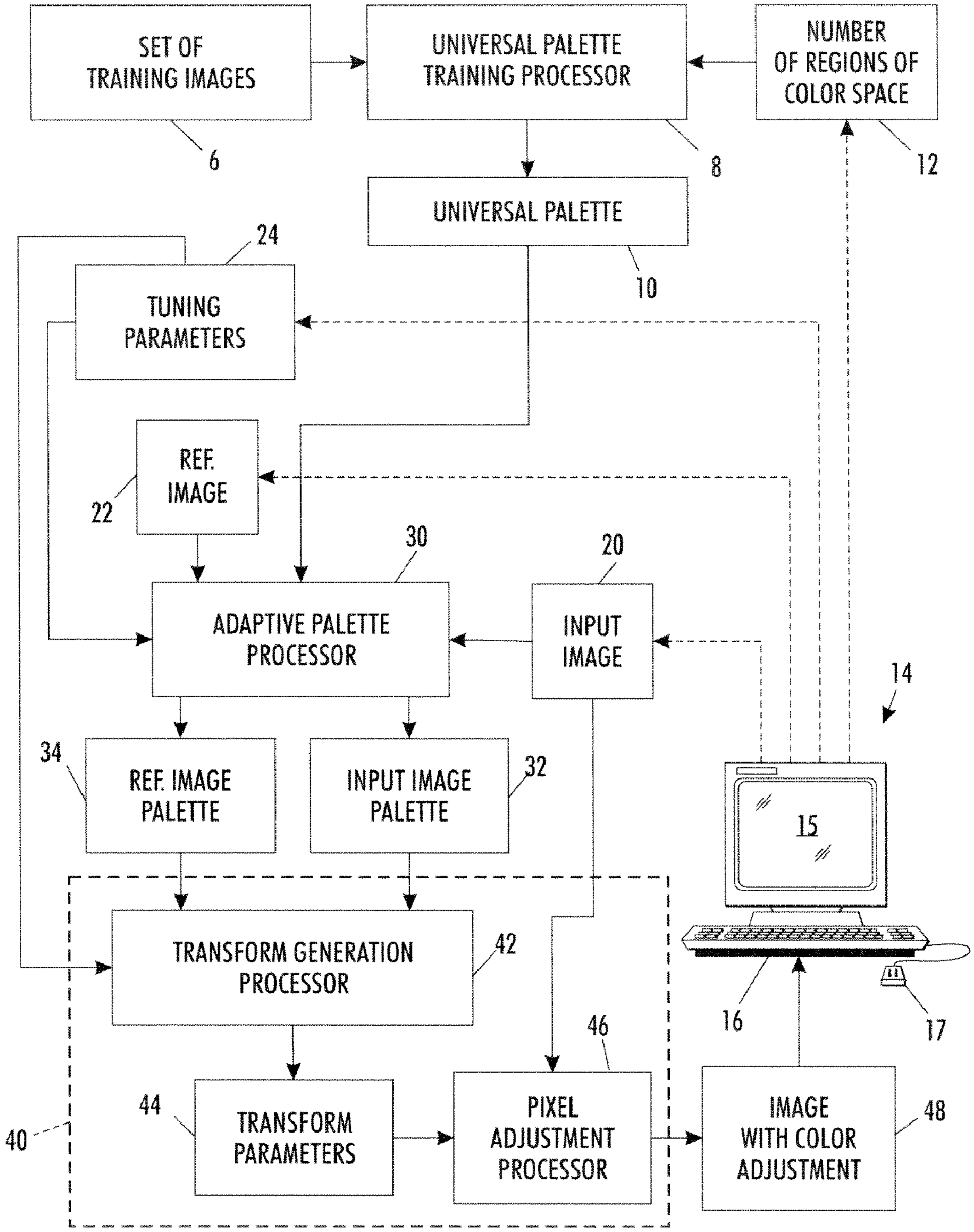
FIG. 1 diagrammatically shows an image color adjustment system.

With reference to FIG. 1, a set of training images 6 is processed by a universal palette training processor 8 to generate a universal palette 10 that is statistically representative of pixels of the set of training images 6. In one approach, the universal palette 10 is defined by a mixture model having a plurality of mixture model components. In some embodiments, each mixture model component corresponds to a color region of a color space (such as an RGB color space, an Lab color space, or so forth), and the number of mixture model components therefore in these embodiments corresponds to a number of regions 12 into which the color space is divided. In some embodiments, this number 12 is a user-selectable number. The number of regions of color space 12 may be selected by the user, for example by employing an optional user interface 14 including a display 15 and one or more user input devices such as an illustrated keyboard 16 and an illustrated mouse 17. The illustrated user interface 14 is a computer, but in other embodiments the user interface may be otherwise embodied, such as being embodied as a digital camera, camcorder, handheld portable media player, or so forth having an LCD display and user input devices in the form of buttons, a joystick, or so forth.

The user also employs the user interface 14 to identify an input image 20 whose coloration is to be adjusted, and to identify a reference image 22 having coloration toward which the input image 20 is to be adjusted. The user optionally may also input other tuning parameters 24 for controlling the color adjustment, such as parameters selecting a subset of the total number 12 of regions of color space to be adjusted.

The color adjustment system further includes an adaptive palette processor 30 that adapts the universal palette 10 to generate an input image palette 32 that is statistically representative of the input image 20, and a reference image palette 34 that is statistically representative of the reference image 22. In embodiments in which the universal palette 10 is a mixture model, this adaptation entails adjusting the mixture model components to be statistically representative of the pixels of the relevant image 20, 22 that is the target of the adaptation processing. In such embodiments, each of the three mixture models defining the respective universal, input image, and reference image palettes 10, 32, 34 has the same number of mixture model components, and there is a one-to-one correspondence between mixture model components of the three palettes 10, 32, 34.

An image adjustment processor 40 is configured to adjust at least some pixels of the input image 20 to generate adjusted pixels that are statistically represented by the reference image palette 34. The illustrated image adjustment processor 40 includes a transform generation processor 42 configured to generate transform parameters 44 relating parameters of corresponding components of the input image mixture model 32 and the reference image mixture model 34, and further includes a pixel adjustment processor 46 configured to apply transforms constructed from the transform parameters 44 to pixels of the input image 20 to generate the adjusted pixels that are statistically represented by the reference image palette 34. An image with color adjustment 48 suitably comprises the adjusted pixels, and optionally also comprises unadjusted pixels of the input image 20 if the adjustment is applied to a sub-set of the pixels of the input image 20. The adjusted image 48 is suitably displayed on the display 15 of the user interface 14 for user review and optional further processing. Alternatively or additionally, the adjusted image 48 may be stored in a hard drive or other digital storage medium of the user interface 14 or on a digital storage medium accessible from the user interface 14, such as an Internet-based data storage, a removable optical disk, a removable flash memory unit, or so forth.

The computational components 8, 30, 40 and related digital data storage components of the system of FIG. 1 can be variously embodied, such as for example as software or firmware running on the user interface 14 (which may itself be, for example, a computer, digital camera, camcorder, cellular telephone, or substantially any other digital electronic device having computational capability and digital memory or access thereto). The computational components 8, 30, 40 may also be embodied as executable instructions stored on a digital storage medium such as an optical disk, random access memory (RAM), read-only memory (ROM), flash memory, magnetic disk, or so forth, such executable instructions being executable on a digital processor of a computer, digital camera, camcorder, or other digital device to embody the computational components 8, 30, 40. The related digital data storage components such as the set of training images 6 may be stored on the same digital storage medium or on a different digital storage medium. Moreover, in some systems the processor 8 and training images 6 may be omitted in favor of one or a set of stored a priori determined universal palettes 10 (see example described infra referencing FIG. 2).

Having provided an overview of the color adjustment system with reference to FIG. 1, some illustrative embodiments are now described in additional detail. In these illustrative embodiments, the palettes 10, 32, 34 are defined by Gaussian mixture models, with each Gaussian component corresponding to a region of a color space. Operation of the universal palette training processor 8 in such illustrative embodiments is as follows.

The universal palette 10 is modeled in these illustrative embodiments as a color palette with a probabilistic model in the form of a Gaussian mixture model (GMM). The parameters of a GMM are denoted herein as $\lambda=\{\omega_i, \mu_i, \Sigma_i, i=1 \ldots N\}$ where $\omega_i$, $\mu_i$ and $\Sigma_i$ are respectively the weight, mean vector and covariance matrix of Gaussian indexed i and N denotes the number of Gaussian components of the mixture model. Let x be an observation and q its associated random hidden variable, that is, the variable indicating which Gaussian component emitted x. The likelihood that observation x was generated by the GMM is:

$$p(x \mid \lambda) = \sum_{i=1}^{N} \omega_i p_i(x \mid \lambda), \quad (1)$$

where $p_i(x|\lambda)=p(x|q=i, \lambda)$. The weights $\omega_i$ are subject to the constraint:

$$\sum_{i=1}^{N} \omega_i = 1. \tag{2}$$

The components $p_i$ are given by:

$$p_i(x_t \mid \lambda) = \frac{\exp\left\{-\frac{1}{2}(x_t-\mu_i)'\sum_i^{-1}(x_t-\mu_i)\right\}}{(2\pi)^{D/2}|\sum_i|^{1/2}}, \tag{3}$$

where the notation |.| denotes the determinant operator and D is the dimensionality of the feature space.

It is assumed in these illustrative examples that the covariance matrices $\Sigma_i$ are diagonal. This assumption is justified insofar as: (i) any distribution can be approximated with an arbitrary precision by a weighted sum of Gaussians with diagonal covariances; and (ii) the computational cost of diagonal covariances is lower than the cost involved by full covariances. For convenience, the notation $\sigma_i^2=\text{diag}(\Sigma_i)$ is used herein.

Let $\lambda^u$ denote the parameters of the GMM defining the universal palette 10. Let $X=\{x_t, t=1 \ldots T\}$ denote the set of training pixels in the color space of choice (for example, an RGB color space, an Lab color space, or so forth) extracted from the set of training images 6, which include a suitable number of various images. The parameters of the GMM are suitably estimated by maximizing a log-likelihood function log $p(X|\lambda^u)$ This technique is generally referred to as Maximum Likelihood Estimation (MLE). A known procedure for MLE is the Expectation Maximization algorithm. See, for example, Dempster et al., "Maximum likelihood from incomplete data via the EM algorithm", *Journal of the Royal Statistical Society Series B,* vol. 39 no. 1, pp. 1-38 (1977), which is incorporated herein by reference in its entirety. EM alternates two steps: (i) an expectation (E) step in which the posterior probabilities of mixture occupancy (also referred to as occupancy probabilities) are computed based on the current estimates of the parameters; and (ii) a maximization (M) step where the parameters are updated based on the expected complete data log-likelihood which depends on the occupancy probabilities computed in the E-step. In the following, for the E-step $\gamma_i(x_t)=p(q_t=i|x_t,\lambda^u)$ denotes the occupancy probability, that is, the probability for observation $x_t$ to have been generated by the i-th Gaussian component of the GMM. The occupancy probabilities $\gamma_i(x_t)$ are suitably computed using Bayes formula:

$$\gamma_i(x_t) = \frac{\omega_i^u p_i(x_t \mid \lambda^u)}{\sum_{j=1}^{N} \omega_j^u p_j(x_t \mid \lambda^u)}. \tag{4}$$

The M-step re-estimation equations are suitably set forth as:

$$\hat{\omega}_i^u = \frac{1}{T}\sum_{t=1}^{T} \gamma_i(x_t), \tag{5}$$

-continued $$\hat{\mu}_i^u = \frac{\sum_{t=1}^{T} \gamma_i(x_t)x_t}{\sum_{t=1}^{T} \gamma_i(x_t)}, \tag{6}$$

and $$(\hat{\sigma}_i^u)^2 = \frac{\sum_{t=1}^{T} \gamma_i(x_t)x_t^2}{\sum_{t=1}^{T} \gamma_i(x_t)} - (\hat{\mu}_i^u)^2, \tag{7}$$

where $x^2$ is used as a shorthand notation for diag(xx').

The EM algorithm is guaranteed to converge to a local optimum, but not necessarily to a global optimum. Therefore, the optimum that is obtained by the EM algorithm depends on the initialization parameters. For the given set of training images 6, different initialization conditions will, in general, lead to different GMM parameters for the universal palette 10. In the illustrative examples set forth herein, the parameters of the GMM defining the universal model 10 are initialized using the following approach (followed by optimization using the EM algorithm). A small sub-sample of vectors is taken and agglomerative clustering is performed until the number of clusters is equal to the desired number of Gaussian components of the GMM (that is, equal to the number of regions of color space 12 for embodiments in which each Gaussian component corresponds to a region of the color space). Then weights $\omega_i^u$ are initialized uniformly, the means $\mu_i^u$ are initialized at the cluster centroid positions, and the covariance matrices $\Sigma_i^u$ are initially isotropic with small values on the diagonal. The EM algorithm is then performed starting with these initialized parameter values to obtain optimized values for the GMM parameters $\omega_i^u$, $\mu_i^u$, and $\Sigma_i^u$ (or, equivalently, $(\sigma_i^u)^2=\text{diag}(\Sigma_i^u)$) that define the universal palette 10.

Some illustrative embodiments of the adaptive palette processor 30 are next described. In these illustrative embodiments, the GMM-based universal palette 10 is utilized, and it is again assumed that each Gaussian component of the GMM represents a region of color space, and that there are N regions of color space 12. The palette adaptation process is designed such that the Gaussian components of the adapted models 32, 34 keep a one-to-one correspondence with the Gaussian components of the universal palette 10. By transitivity, this means that there is a correspondence between the Gaussian components of two adapted models 32, 34. This enables performance of a safe color transform, since a transform relating a Gaussian component of the input image palette 32 and a corresponding Gaussian component of the reference image palette 34 can readily be ensured to remain within the region of color space represented by those corresponding Gaussian components.

In the following illustrative adaptation examples, let X now denote the set of color values of each pixel in the image that is used for the adaptation. In other words, X denotes the set of color values of each pixel in the input image 20 in the case of adapting the universal palette 10 to generate the input image palette 32; whereas, X denotes the set of color values of each pixel in the reference image 22 in the case of adapting the universal palette 10 to generate the reference image palette 34. In the following, $\lambda^a$ denotes the parameters of an adapted model (that is, the GMM defining the input image palette 32, or the GMM defining the reference image palette 34). In these illustrative examples the adaptation of the GMM representing the universal palette 10 is performed using the Maximum a Posteriori (MAP) criterion. See, for example, Gauvain et al., "Maximum a posteriori estimation for multivariate Gaussian mixture observations of Markov chains", *IEEE trans. On speech and Audio Processing,* vol. 2, pp. 291-99 (1994), which is incorporated herein by reference in its entirety. The goal of MAP estimation is to maximize the posterior probability $p(\lambda^a|X)$ or equivalently $\log p(X|\lambda^a)+\log p(\lambda^a)$. Hence, a difference of MAP compared with MLE lies in the assumption of an appropriate prior distribution of the parameters to be estimated. Implementation of MAP includes: (i) choosing the prior distribution family; and (ii) specifying the parameters of the prior distribution. It was shown in Gauvain et al. that the prior densities for GMM parameters can be adequately represented as a product of Dirichlet (prior on weight parameters) and normal-Wishart densities (prior on Gaussian parameters). When adapting a universal model (in the present case, the GMM defining the universal palette 10) with MAP to more specific conditions (in the present case, either the input image 20 or the reference image 22), it is advantageous to use the parameters of the universal model as a priori information on the location or values of the adapted parameters in the parameter space. As further shown in Gauvain et al., one can also apply the EM procedure to MAP estimation. During the E-step, the occupancy probabilities $\gamma_t(i)$ are computed as was the case for MLE:

$$\gamma_i(x_t)=p(q_t=i|x_t,\lambda^a) \quad (8),$$

and the adapted GMM parameters are computed as:

$$\hat{\omega}_i^a = \frac{\sum_{t=1}^{T}\gamma_i(x_t)+\tau}{T+\sum_{i=1}^{N}\tau}, \quad (9)$$

$$\hat{\mu}_i^a = \frac{\sum_{t=1}^{T}\gamma_i(x_t)x_t+\tau\mu_i^u}{\sum_{t=1}^{T}\gamma_i(x_t)+\tau}. \quad (10)$$

and $$(\hat{\sigma}_i^a)^2 = \frac{\sum_{t=1}^{T}\gamma_i(x_t)x_t^2+\tau[(\sigma_i^u)^2+(\mu_i^u)^2]}{\sum_{t=1}^{T}\gamma_i(x_t)+\tau} - (\hat{\mu}_i^a)^2. \quad (11)$$

The parameter $\tau$ is called a relevance factor. It keeps a balance between the a priori information contained in the generic model and the new information brought by the image-specific data. If a mixture component i was estimated with a relatively small number of observations $\Sigma_{t=1}^{T}\gamma_i(x_t)$, then more emphasis is put on the a priori information. On the other hand, if the mixture component i was estimated with a relatively large number of observations, more emphasis will be put on the new evidence. The relevance factor $\tau$ is suitably chosen manually, and a suitable value is $\tau=10$.

Each of (i) the adapted GMM representing the adapted input image palette 32 and (ii) the adapted GMM representing the adapted reference image palette 34 contains the same number of Gaussian components as the GMM representing the universal palette 10. If each Gaussian component corresponds to a region of color space, then it follows that each of the two palettes 32, 34 adapted from the same universal palette 10 also have the same number of regions of color space 12.

The illustrative embodiments described for the universal palette training processor 8 and for the adaptive palette processor 30 output the palettes 10, 32, 34 each represented as a Gaussian mixture model (GMM). Other mixture models are also contemplated as representations of these palettes, such as Laplacian mixture models. The EM optimization algorithm is described as an illustrative example, and it will be appreciated that other optimization algorithms can also be used, such as gradient descent optimization. In the same manner the MAP criterion for adaptation is described as an illustrative example and it will be appreciated that other adaptation criteria can also be used, such as the Maximum Likelihood Linear Regression (MLLR).

Some illustrative embodiments of the image adjustment processor 40 including the transform generation processor 42 and the pixel adjustment processor 46 are next described. In these illustrative embodiments, the adapted GMM-based palettes 32, 34 are utilized, and it is again assumed that the Gaussian components of the GMM representations of the palettes 32, 34 have one-to-one correspondence and represent N regions of color space 12.

First a unimodal case is considered. Two normal multivariate distributions x (corresponding in the present case to the pixels of the input image 20) and y (corresponding in the present case to the pixels of the reference image 22) are assumed, with parameters $(\mu_x, \Sigma_x)$ and $(\mu_y, \Sigma_y)$ respectively. It is desired to find a transform f such that the statistics of f(x) (that is, adjusted pixels of the color-adjusted input image in the present case) match those of y (that is, pixels of the reference image 22 in the present case). In a suitable approach, the transform f is selected such that E[f(x)]=E[y] and cov[f(x)]=cov[y] where E[ . . . ] denotes a statistical expectation and cov[ . . . ] denotes a statistical covariance. Considering linear transforms of the form: f(x)=Ax+b where A is a diagonal matrix and b is a vector, this gives the set of equations: $A\mu_x+b=\mu_y$ and $A\Sigma_xA'=\Sigma_y$, which leads to $A=\Sigma_y^{1/2}\Sigma_x^{-1/2}$ and $b=\mu_y-E_y^{1/2}\Sigma_x^{-1/2}\mu_x$ in the case of diagonal covariance matrices. As expected, in the trivial case in which x and y are identical distributions these equations yield A as the identity matrix and b as a null vector.

The operation of the transform generation processor 42 is now considered, for the illustrative embodiments in which Gaussian mixture models are used to represent the palettes 32, 34. It is desired to find a mapping from each Gaussian component in the reference image palette 34 to a corresponding one of the Gaussian components of the input image palette 32. For the i-th corresponding pair of Gaussians in the palettes 32, 34 it is desired to compute a transform parameters $(A_i,b_i)$ which are in these embodiments the transform parameters 44. This can be done assuming a linear transform of the form f(x)=Ax+b and using the derived relationships $A_i=(\Sigma_i^y)^{1/2}(\Sigma_i^x)^{-1/2}$ and $b_i=\mu_i^y-(\Sigma_i^y)^{1/2}(\Sigma_i^x)^{-1/2}\mu_i^x$ where the superscript "x" denotes a parameter of the GMM defining the input image palette 32, the superscript "y" denotes a parameter of the GMM defining the reference image palette 34, and the subscript "i" indexes the pair of corresponding Gaussian components of the two palettes 32, 34.

The operation of the pixel adjustment processor 46 is now considered, for the illustrative embodiments in which Gaussian mixture models are used to represent the palettes 32, 34 and the transform parameters 44 are linear transform parameters $(A_i,b_i)$. The linear transformation parameters (A(x),b(x)) for adjusting a given pixel x of the input image 20 is suitably computed as a weighted combination of the transformation parameters $(A_i,b_i)$, where the weighting coefficient for each Gaussian component indexed i depends on the probability that the input image pixel x lies in the region of color space corresponding to the Gaussian component indexed i. This probability is the occupancy probability $\gamma_i(x)$ and the weighted combination of the transformation parameters $(A_i, b_i)$ defining the pixel adjustment parameters (A(x),b(x)) is suitably given by:

$$A(x)=\Sigma_{i=1}^{N}\gamma_i(x)A_i \quad (12),$$

and $$b(x)=\Sigma_{i=1}^{N}\gamma_i(x)b_i \quad (13).$$

Using these parameters, the adjustment of the pixel x of the input image 20 is suitably computed as $x^{adj}=A(x)\cdot x+b(x)$ where $x^{adj}$ denotes the adjusted pixel value. This approach may be intuitively explained as follows. One computes N probability maps, one for each region of color space, and the probability maps are used as masks for the application of the transform for the given color region. As expected, in the trivial case in which the input image 20 and the reference image 22 are identical images, it follows that A(x) is the identity matrix, b(x) is the null vector, and the image is not adjusted at all.

The operation of the image adjustment system of FIG. 1 can be adjusted by changing the number of regions of color space 12, or by adjusting optional tuning parameters 24. Concerning the adjustment of the number of regions of color space 12, this affects the safety of the method. Only "similar" colors are transferred from the reference image 22 to the input image 20 as constrained by the one-to-one mapping of the Gaussian components of the GMM representations of the adapted reference and input image palettes 34, 32. However, the notion of color similarity depends on the universal color palette 10. Two colors can be considered similar if their distributions of occupancy probability are similar. The larger the number of colors in the palette, the closer two colors have to be in the space to be considered similar and the more subtle the effects of the transfer.

Another way of viewing this is that for smaller values of the number of regions of color space 12, the size of each region is larger and more "different" colors may be deemed to lie within the same region of color space. This results in larger adjustments to the coloration of the input image 20. In contrast, for larger values of the number of regions of color space 12, the size of each region is smaller and only rather similar colors can be deemed to lie within the same region of color space. This results in rather smaller adjustments to the coloration of the input image 20. The size of the regions of color space, as controlled by the number of such regions 20, provides a bound on the maximum extent of pixel color adjustment.

Figure 2:
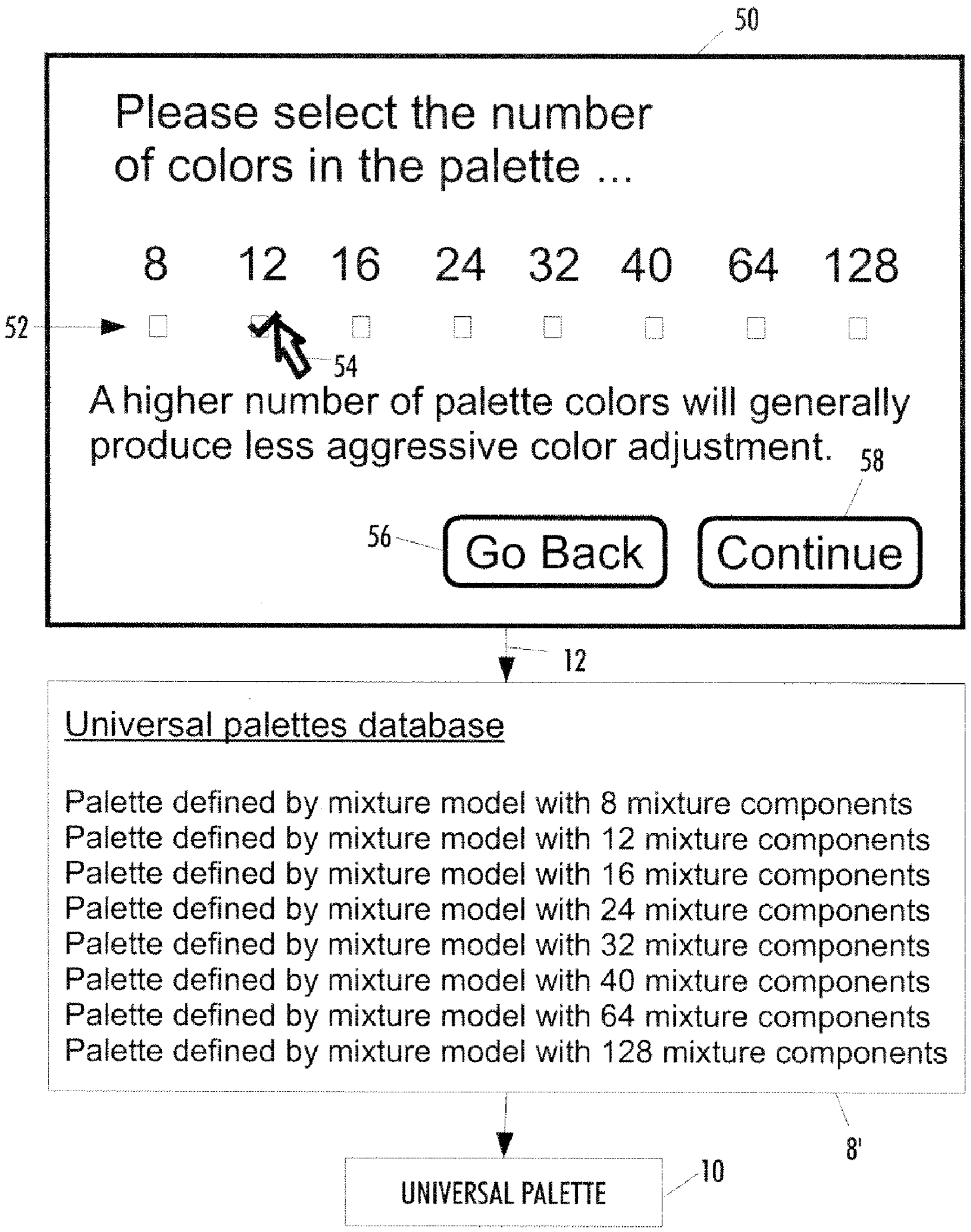
FIGS. 2 and 3 diagrammatically show illustrative user interface dialog windows via which a user may control the color adjustment process.

With continuing reference to FIG. 1 and with further reference to FIG. 2, a suitable graphical user interface (GUI) and associated data structure for enabling the user to select the number of regions of color space 12 via the user interface 14 is illustrated. A dialog window 50 is displayed on the display 15 of the user interface 14. The dialog window 50 lists a predetermined selection of selectable values for the number of regions 12, including in the illustrated embodiment the values: 8, 12, 16, 24, 32, 40, 64, 128. It will be appreciated that these are examples and different, fewer, or additional values can be included. The user selects the value of interest using a corresponding set of checkboxes 52 that can be selected using a pointer 54 controlled by the mouse 17 or another pointing device, or by tabbing the selection across the checkboxes 52 using TAB key of the keyboard 16, or by another suitable input device. The checkboxes 52 are preferably configured to be mutually exclusive, that is, selecting a checkbox for one value suitably deselects any other previously selected checkbox so that the output of the set of checkboxes 52 is a singular value. The dialog window 50 provided as an illustrative example also includes optional helpful explanatory text, in the illustrated example including: "Please select the number of colors in the palette . . . " and "A higher number of palette colors will generally produce less aggressive color adjustment." Again, different, less, or more explanatory text can be provided. The illustrated dialog window 50 includes the further controls of a "Go Back" button 56 and a "Continue" button 58 for moving backward or forward in the user-interactive image adjustment process.

With continuing reference to FIG. 2, the user selection output by the dialog window 50 is the number of regions of color space 12. In this embodiment, a universal palette has been trained or otherwise derived a priori for each of the selectable numbers of color regions: 8, 12, 16, 24, 32, 40, 64, 128. Accordingly, in the embodiment of FIG. 2 the universal palette training processor 8 is suitably replaced by a universal palettes database 8' that stores the a priori determined universal palettes for the selectable numbers of color regions: 8, 12, 16, 24, 32, 40, 64, 128. The appropriate a priori determined universal palette is retrieved and serves as the universal palette 10 of FIG. 1.

The embodiment of FIG. 2 provides a system in which the training processor 8 can be omitted from a provided system in favor of providing the database 8'. It will be appreciated that the a priori determined universal palettes of the database 8' are suitably determined by a system similar to the training processor 8 described herein.

In another embodiment, the training processor 8 and training set 6 are included in the system. This enables generation of a universal palette 10 with an arbitrary number 12 of color regions. In such an embodiment, the dialog window 50 can be utilized, or can be replaced by a dialog window that enables the user to input an arbitrary positive integer value for the number of regions of color space 12 via the user interface 14. Upon receipt of the number 12 of color regions the universal palette training processor 8 is invoked to generate the universal palette 10 as described herein.

Further user control of the color adjustment process can be provided by optional tuning parameters 24. For example, by employing suitable user-selectable tuning parameters the adjustment may entail performing a full color transfer or only a partial one. A suitable tuning parameter for this user control is denoted herein as $\alpha$, and the formulas for the adjustment parameters (A(x),b(x))are modified as follows:

$$A(x)=\Sigma_{i=1}^{N}\gamma_i(x)[\alpha A_i+(1-\alpha)I] \quad (14),$$

and $$b(x)=\Sigma_{i=1}^{N}\gamma_i(x)\alpha b_i \quad (15).$$

If $\alpha=1$ then a full transfer is performed. On the other hand, if $\alpha=0$, the input image 20 is not modified by the color adjustment at all.

For a finer control, it is also contemplated to set a different value $\alpha_i$ for each color region. This enables transfer or adjustment of only selected color regions, as well as control of the amount of adjustment for each color region.

Figure 3:
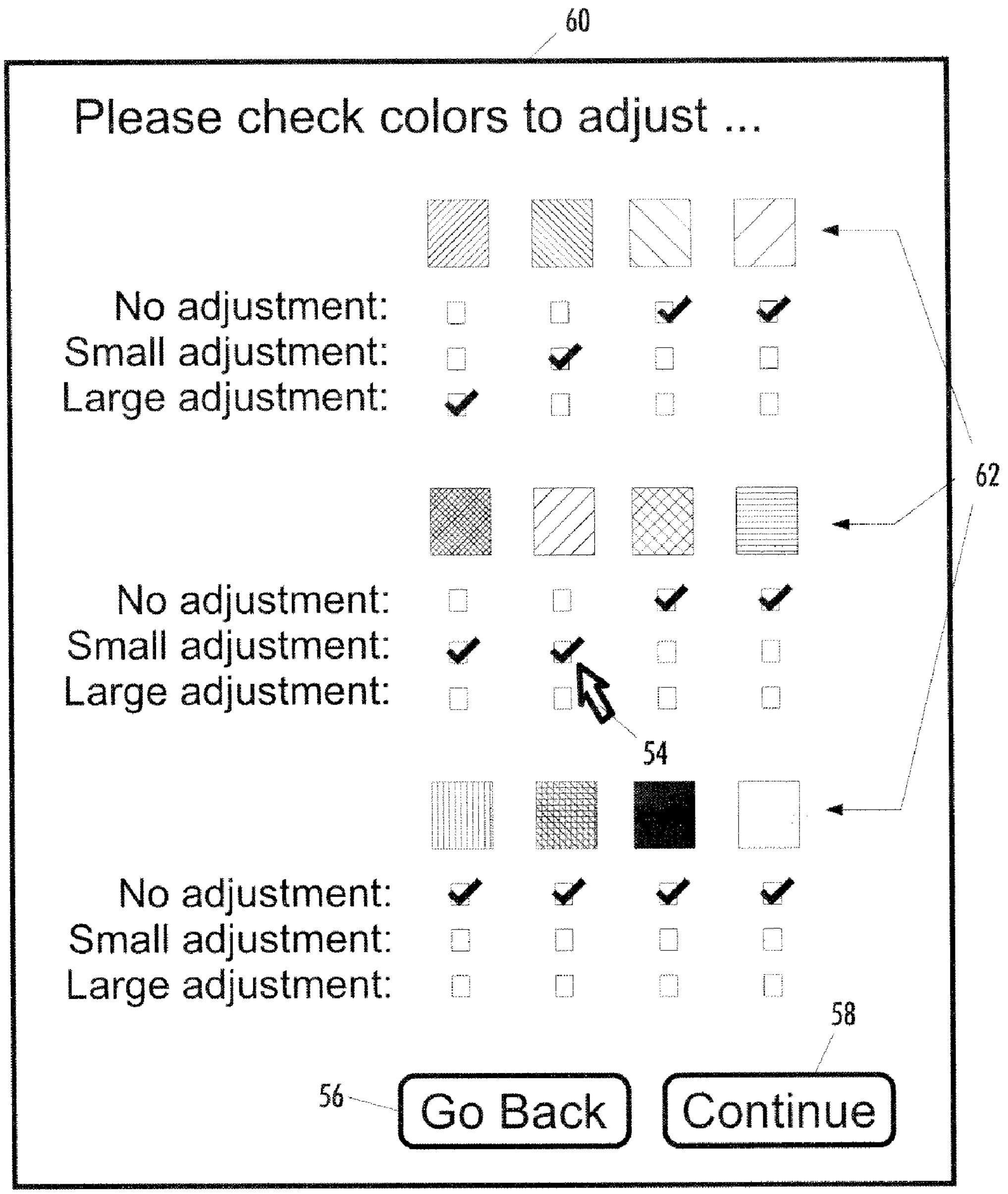

With reference to FIG. 3, an illustrative example of a user interface suitable for implementing color region-selective color adjustment is described. In this embodiment, each Gaussian component corresponds to a region of the color space. In some such embodiments, the optimized universal palette 10 is visually represented in a dialog window 60 by a set of color squares 62, one color square per region of color space, in which each color square has a color corresponding to the mean $\mu_i^u$ of the corresponding Gaussian component of the universal palette 10. Three different checkboxes are provided for each color square, enabling the user to select either "No adjustment" ($\alpha_i$=0), "Small adjustment" ($\alpha_i$=0.5 or some other intermediate value in the range [0,1]), or "Large adjustment" ($\alpha_i$=1). The three checkboxes for each color square are preferably configured to be mutually exclusive, that is, selecting a checkbox for one value suitably deselects any other previously selected checkbox so that the selected value $\alpha_i$ for each color region is a singular value. The illustrated dialog window 60 further includes the pointer 54 and backward and forward buttons 56, 58 which are user-operable via the user interface 14 similarly to the operation as described for the dialog window 50 of FIG. 2. The dialog window of FIG. 3 enables selection amongst three discrete values of $\alpha_i$ for each color region; alternatively, one can provide an analog input for each color region such as a slider bar for each color region to enable selection of any arbitrary value for $\alpha_i$ in the range [0,1].

As another option, instead of displaying colors corresponding to the means $\mu_i^u$ of the Gaussian components of the universal palette 10, each color square 62 can instead be divided into two sub-squares that display the colors corresponding to the means of corresponding Gaussian components of the input image palette 32 and the reference image palette 34. In this way, the user can visually see the proposed color adjustments and can make the selections as to which color adjustments to implement via the checkboxes.

A color adjustment system was constructed substantially in conformance with the system depicted in FIG. 1. This system was tested using 20 sunrise/sunset images. Color adjustments were performed in either CbCr space or RGB space, with a universal palette of sixteen color regions learned on an independent set of roughly 2,000 images. The color adjustments employed $\alpha_i$=1 for all color regions (full color adjustment). Visual results for the color adjusted images were considered to provide more natural results as subjectively determined by human viewers. The color adjustments were also repeated using different numbers of color regions, and using different values of $\alpha_i$ (but the same value for all color regions, that is, a single parameter $\alpha$ was adjusted).

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. An image adjustment system comprising:

an adaptive palette processor configured to adapt a universal palette to generate (i) an input image palette statistically representative of pixels of an input image and (ii) a reference image palette statistically representative of pixels of a reference image; and an image adjustment processor configured to adjust at least some pixels of the input image to generate adjusted pixels that are statistically represented by the reference image palette;

wherein the input image palette comprises an input image mixture model, the reference image palette comprises a reference image mixture model, and there is a one-to-one correspondence between components of the input image mixture model and components of the reference image mixture model.

2. The image adjustment system as set forth in claim 1, wherein the adaptive palette processor and the image adjustment processor are defined by a computer executing software.

3. The image adjustment system as set forth in claim 2, further comprising:

a display device operatively connected with the computer to display at least an adjusted image comprising at least the adjusted pixels.

4. The image adjustment system as set forth in claim 1, wherein the image adjustment processor comprises:

a transform generation processor configured to generate transform parameters relating parameters of corresponding components of the input image mixture model and the reference image mixture model; and a pixel adjustment processor configured to apply transforms constructed from the transform parameters to pixels of the input image to generate the adjusted pixels that are statistically represented by the reference image palette.

5. The image adjustment system as set forth in claim 4, wherein each of the input image mixture model and the reference image mixture model is a Gaussian mixture model, and the pixel adjustment processor is configured to apply linear transforms constructed from the transform parameters.

6. The image adjustment system as set forth in claim 1, wherein each component of the input image mixture model and the corresponding component of the reference image mixture model is representative of a color characteristic selected from a group consisting of (i) a region of a color space, (ii) a hue region, (iii) a saturation region, and (iv) an intensity region.

7. The image adjustment system as set forth in claim 1, wherein each component of the input image mixture model and the corresponding component of the reference image mixture model is representative of a region of a color space.

8. The image adjustment system as set forth in claim 7, further comprising:

a user interface including a display and at least one user input device, the user interface configured to display a set of colors indicative of at least one of (i) the regions of color space represented by the components of the input image palette, (ii) the regions of color space represented by the components of the reference image palette, and (iii) the regions of color space represented by the components of the input image palette, the image adjustment processor configured to adjust those pixels of the input image lying within one or more regions of color space selected via the user interface and the display.

9. An image adjustment method comprising:

adapting a universal palette to generate (i) an input image palette statistically representative of pixels of an input image and (ii) a reference image palette statistically representative of pixels of a reference image; and adjusting at least some pixels of the input image to generate adjusted pixels that are statistically represented by the reference image palette;

wherein the input image palette comprises an input image mixture model, the reference image palette comprises a reference image mixture model, and there is a one-to-one correspondence between components of the input image mixture model and components of the reference image mixture model; and wherein the adapting and the adjusting are performed by a digital electronic device.

10. The image adjustment method as set forth in claim 9, further comprising:

displaying or storing an adjusted image comprising at least the adjusted pixels.

11. The image adjustment method as set forth in claim 9, wherein the adjusting comprises:

generating transform parameters relating parameters of corresponding components of the input image mixture model and the reference image mixture model; and applying transforms constructed from the transform parameters to pixels of the input image to generate the adjusted pixels that are statistically represented by the reference image palette.

12. The image adjustment method as set forth in claim 11, wherein each of the input image mixture model and the reference image mixture model is a Gaussian mixture model, and the pixel adjustment processor is configured to apply linear transforms constructed from the transform parameters.

13. The image adjustment method as set forth in claim 12, wherein the applying of transforms comprises applying linear transforms constructed from the transform parameters.

14. The image adjustment method as set forth in claim 9, wherein each component of the input image mixture model and the corresponding component of the reference image mixture model is representative of a color characteristic selected from a group consisting of (i) a region of a color space, (ii) a hue region, (iii) a saturation region, and (iv) an intensity region.

15. An image adjustment system comprising:

an image adjustment processor configured to adjust at least some pixels of an input image to generate adjusted pixels that are statistically represented by a reference palette defined by a mixture model comprising mixture model components in which each mixture model component is representative of a region of a color space; and a user interface including a display and at least one user input device, the user interface configured to display a set of colors indicative of the regions of color space represented by the mixture model components and to receive a selection of one or more regions of the color space represented by the mixture model components, the image adjustment processor configured to adjust those pixels of the input image lying within the one or more selected regions of the color space;

wherein the user interface is further configured to receive a selection of a number of the regions of the color space whereby the user selects the number of mixture model components, and wherein the image adjustment system further comprises a reference palette generation processor configured to generate the reference palette as a mixture model with the selected number of mixture model components wherein the reference palette generation processor comprises an adaptive palette processor configured to adapt mixture model components of a universal palette defined by a mixture model with the selected number of mixture model components to generate the reference palette such that the reference palette is statistically representative of pixels of a reference image.

16. The image adjustment system as set forth in claim 15, wherein:

the user interface is configured to receive a weight value for each selected region of the color space, and the image adjustment processor is configured to adjust each adjusted pixel based on the received weight value for the region of color space in which lies the adjusted pixel.

17. The image adjustment system as set forth in claim 15, wherein the image adjustment processor is configured to invoke the adaptive palette processor to adapt mixture model components of the universal palette to generate an input image palette that is statistically representative of pixels of the input image, the image adjustment processor further comprising:

a transform generation processor configured to generate transform parameters relating parameters of corresponding mixture model components of the input image palette and the reference palette; and a pixel adjustment processor configured to apply transforms constructed from the transform parameters to pixels of the input image to generate the adjusted pixels that are statistically represented by the reference palette.

18. An image adjustment system as set forth in claim 17, wherein the user interface is configured to display both the set of colors indicative of the regions of color space represented by the mixture model components of the reference palette and a corresponding set of colors indicative of corresponding regions of color space represented by the mixture model components of the input image palette.

19. An image adjustment system as set forth in claim 1, wherein the image adjustment processor is configured to receive a stream of video frames defining the input image and is configured to adjust at least some pixels of the stream of video frames to generate the adjusted pixels.

20. A digital storage medium storing instructions executable on a digital processor to perform a method comprising:

adapting a universal palette to generate (i) an input image palette statistically representative of pixels of an input image and (ii) a reference image palette statistically representative of pixels of a reference image; and adjusting at least some pixels of the input image to generate adjusted pixels that are statistically represented by the reference image palette;

wherein the input image palette comprises an input image mixture model, the reference image palette comprises a reference image mixture model, and there is a one-to-one correspondence between components of the input image mixture model and components of the reference image mixture model.

21. The digital storage medium as set forth in claim 20, wherein the adjusting comprises:

generating transform parameters relating parameters of corresponding components of the input image mixture model and the reference image mixture model; and applying transforms constructed from the transform parameters to pixels of the input image to generate the adjusted pixels that are statistically represented by the reference image palette.

22. The digital storage medium as set forth in claim 20, wherein each of the input image mixture model and the reference image mixture model is a Gaussian mixture model.

23. The digital storage medium as set forth in claim 20, wherein each component of the input image mixture model and the corresponding component of the reference image mixture model is representative of a color characteristic selected from a group consisting of (i) a region of a color space, (ii) a hue region, (iii) a saturation region, and (iv) an intensity region.

* * * * *